(12) United States Patent
Lin et al.

(10) Patent No.: US 11,423,983 B2
(45) Date of Patent: Aug. 23, 2022

(54) MEMORY DEVICE AND DATA WEIGHT STATE DETERMINING METHOD FOR IN-MEMORY COMPUTATION

(71) Applicant: INDUSTRIAL TECHNOLOGY RESEARCH INSTITUTE, Hsinchu (TW)

(72) Inventors: Chih-Sheng Lin, Tainan (TW); Sih-Han Li, New Taipei (TW); Yu-Hui Lin, Hsinchu County (TW); Jian-Wei Su, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 17/322,509

(22) Filed: May 17, 2021

(65) Prior Publication Data

US 2022/0223202 A1     Jul. 14, 2022

(30) Foreign Application Priority Data

Jan. 13, 2021  (TW) ................................ 110101199

(51) Int. Cl.
*G11C 11/00* (2006.01)
*G11C 13/00* (2006.01)
*G11C 7/06* (2006.01)

(52) U.S. Cl.
CPC ............ *G11C 13/004* (2013.01); *G11C 7/062* (2013.01); *G11C 13/0069* (2013.01); *G11C 2013/0054* (2013.01)

(58) Field of Classification Search
CPC .... G11C 13/004; G11C 13/0069; G11C 7/062
(Continued)

(56) References Cited

U.S. PATENT DOCUMENTS 5,097,141 A * 3/1992 Leivian .................. G06F 7/544
706/41
8,203,862 B2   6/2012 Chen et al.
(Continued)

FOREIGN PATENT DOCUMENTS

CN   103425222 A   12/2013
TW   201720118 A   6/2017
TW   202009929 A   3/2020

OTHER PUBLICATIONS

"A 1Mb Multibit ReRAM Computing-In-Memory Macro with 14.6ns Parallel MAC Computing Time for CNN-Based AI Edge Processors"ISSCC 2019, Session 24, SRAM & Computation-in-Memory, 24.1, Feb. 20, 2019.
(Continued)

*Primary Examiner* — Vu A Le
(74) *Attorney, Agent, or Firm* — Maschoff Brennan

(57) ABSTRACT

A memory device for in-memory computation includes data channels, a memory cell array, a maximum accumulated weight generating array, a minimum accumulated weight generating array, a reference generator and a comparator. The data channels are selectively enabled according to data input. The memory cell array generates an accumulated data weight value according to the quantity of enabled data channels, a first resistance and a second resistance. The maximum accumulated weight generating array generates a maximum accumulated weight value according to the quantity of enabled data channels and the first resistance. The minimum accumulated weight generating array generates a minimum accumulated weight value according to the quantity of enabled data channels and the second resistance. The reference generator generates reference value(s) according to the maximum and minimum accumulated weight values. The comparator compares the accumulated data weight
(Continued)

value with the reference value(s) to generate a data weight state.

10 Claims, 8 Drawing Sheets

(58) Field of Classification Search
USPC ........................................................ 365/148
See application file for complete search history.

(56) References Cited

U.S. PATENT DOCUMENTS

| 8,531,225 | B1 | 9/2013 | Hussain |
| 8,634,227 | B2 | 1/2014 | Yu et al. |
| 10,073,733 | B1* | 9/2018 | Jain ................ G06F 11/108 |
| 10,340,003 | B1 | 7/2019 | Chang et al. |
| 2014/0093881 | A1 | 4/2014 | Sugnet et al. |
| 2015/0131383 | A1* | 5/2015 | Akerib ............... G11C 13/004 365/189.011 |
| 2019/0080231 | A1 | 3/2019 | Nestler et al. |
| 2020/0075677 | A1 | 3/2020 | Wada |

OTHER PUBLICATIONS

Chen et al., "A 65nm 1Mb Nonvolatile Computing-in-Memory ReRAM Macro with Sub-16ns Multiplyand-Accumulate foi Binary DNN AI Edge Processors", ISSCC 2018, Session 31, Computation in memory for machine learning, 31.4, Feb. 14, 2018.

Khwa et al., "A 65nm 4Kb Algorithm-Dependent Computing-in-Memory SRAM Unit-Macro with 2.3ns and 55.8TOPS/W Fully Parallel Product-Sum Operation for Binary DNN Edge Processors" ISSCC 2018, Session 31, Computation in memory for machine learning, 31.5, Feb. 14, 2018.

Ni et al., "An Energy-efficient Matrix Multiplication Accelerator by Distributed In-memory Computing on Binary RRAM Crossbar", IEEE, Mar. 10, 2016.

Jain et al., "Computing in Memory With Spin-Transfer Torque Magnetic RAM", Nov. 21, 2017.

TW Office Action in Application No. 110101199 dated Jul. 30, 2021.

* cited by examiner

US 11,423,983 B2

MEMORY DEVICE AND DATA WEIGHT STATE DETERMINING METHOD FOR IN-MEMORY COMPUTATION

CROSS-REFERENCE TO RELATED APPLICATIONS

This non-provisional application claims priority under 35 U.S.C. § 119(a) on Patent Application No(s). 110101199 filed in Taiwan (R.O.C.) on Jan. 13, 2021, the entire contents of which are hereby incorporated by reference.

1. TECHNICAL FIELD

This disclosure relates to a memory device, and relates to a memory device for in-memory computation.

2. BACKGROUND

Resistive random-access memory (ReRAM) can store different data using the different resistance states of multiple memory elements. The resistance state of the memory elements can be obtained using a reference current or voltage, and then the data stored in the memory can be recognized. Currently, the reference current or voltage is usually set to a fixed value or one of multiple sets of fixed values.

However, when the quantity of channels for data input changes, the appropriate reference current or voltage also becomes different. Using a fixed value as the reference current or voltage for determining the resistance state of the memory elements must limit memory devices to operating with a fixed quantity of channels for data input. Therefore, the operating modes of memory devices with varying requirements for the quantity of channels for data input, especially memory devices for in-memory computation, must be limited.

SUMMARY

According to an embodiment of this disclosure, a memory device for in-memory computation includes a number of data channels, a memory cell array, a maximum accumulated weight generating array, a minimum accumulated weight generating array, a reference generator and a comparator. The data channels have the quantity of enabled data channels according to data input. The memory cell array is connected to the data channels, and configured to generate an accumulated data weight value according to the quantity of enabled data channels, a first resistance and a second resistance, wherein the first resistance is less than the second resistance. The maximum accumulated weight generating array is connected to the data channels, and configured to generate a maximum accumulated weight value according to the quantity of enabled data channels and the first resistance. The minimum accumulated weight generating array is connected to the data channels, and configured to generate a minimum accumulated weight value according to the quantity of enabled data channels and the second resistance. The reference generator is connected to the maximum accumulated weight generating array and the minimum accumulated weight generating array, and configured to generate at least one reference value according to the maximum accumulated weight value and the minimum accumulated weight value. The comparator is connected to the memory cell array and the reference generator, and configured to compare the accumulated data weight value with the at least one reference value to generate and output a data weight state.

According to an embodiment of this disclosure, a data weight state determining method for in-memory computation is applicable to a memory device including a number of data channels and a memory cell array. The data weight state determining method includes: generating a maximum accumulated weight value according to the quantity of enabled data channels of the data channels and a first resistance; generating a minimum accumulated weight value according to the quantity of enabled data channels and a second resistance; generating at least one reference value according to the maximum accumulated weight value and the minimum accumulated weight value; and comparing an accumulated data weight value of the memory cell array with the at least one reference value to generate and output a data weight state; wherein the first resistance is less than the second resistance.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
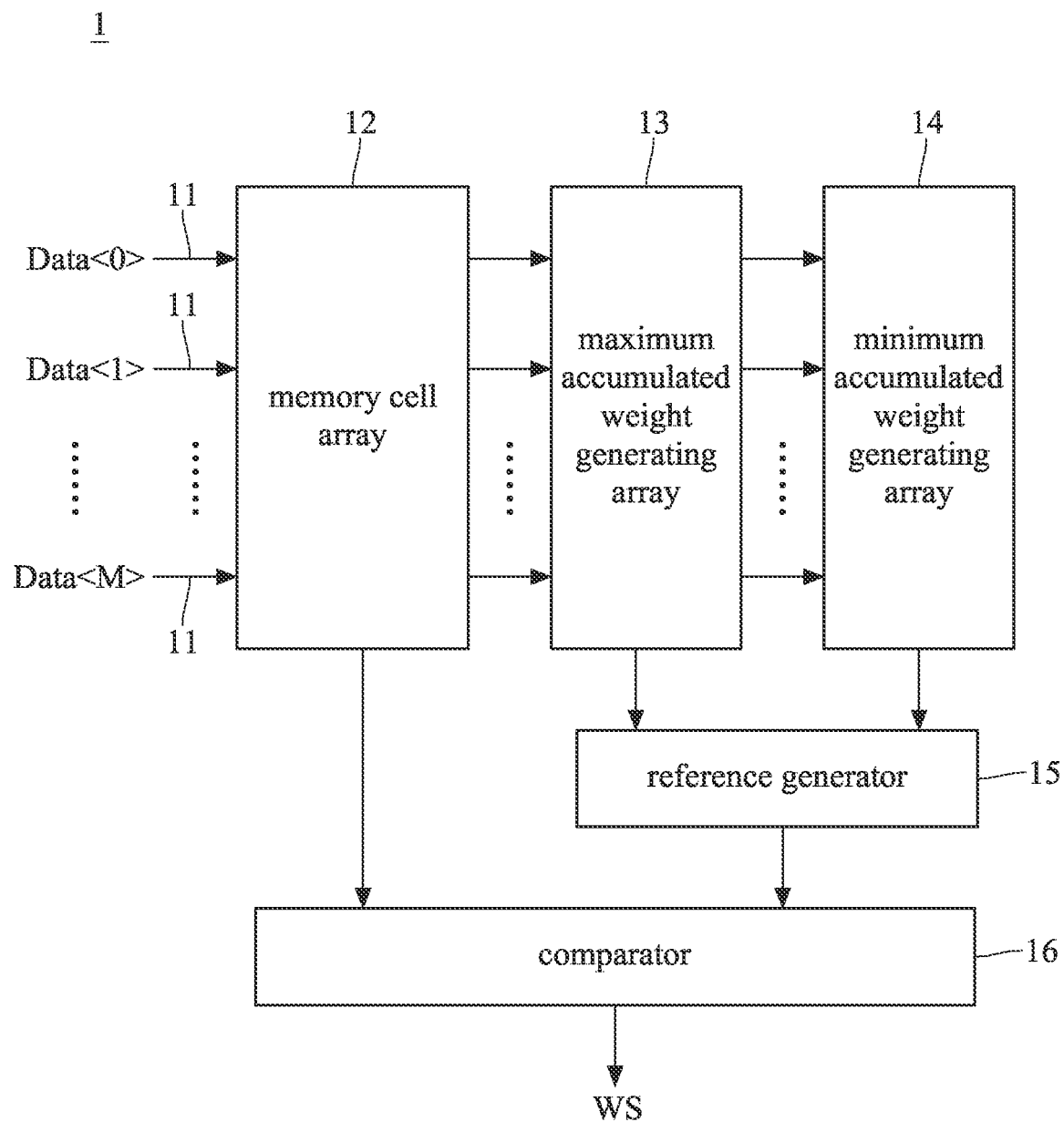
FIG. 1 is a function block diagram of a memory device according to an embodiment of this disclosure.

Please refer to FIG. 1, a function block diagram of a memory device according to an embodiment of this disclosure. As shown in FIG. 1, a memory device 1 includes a number of data channels 11, a memory cell array 12, a maximum accumulated weight generating array 13, a minimum accumulated weight generating array 14, a reference generator 15 and a comparator 16. The data channels 11 are electrically connected to the memory cell array 12, the maximum accumulated weight generating array 13 and the minimum accumulated weight generating array 14. The reference generator 15 is electrically connected to the maximum accumulated weight generating array 13 and the minimum accumulated weight generating array 14. The comparator 16 is electrically connected to the memory cell array 12 and the reference generator 15.

The data channels 11 are configured to receive data input, and selectively enabled according to the data input; that is, the quantity of enabled data channels of the data channels 11 depends on the data input. The data input may include data voltages Data<0>, Data<1>, . . . , and Data<M>, wherein the quantity of the data voltages at a high electric potential is regarded as the quantity of enabled data channels of the data channels 11.

The memory cell array 12 may be a memristor-based memory, such as resistive random-access memory (ReRAM), magnetoresistive memory, etc., or implemented with on-resistance of transistors. The memory cell array 12 includes a number of memory cells respectively connected to the data channels 11. Each of the memory cells have a first resistance or a second resistance, wherein the first resistance is less than the second resistance. The memory cell with the first resistance is in the low-resistance state and stores weight "1"; the memory cell with the second resistance is in the high-resistance state and stores weight "0". The memory cell array 12 can generate an accumulated data weight value according to the quantity of enabled data channels of the data channels 11, the first resistance and the second resistance. The memory cell array 12 may include the same quantity of memory cells as the data channels 11, and the memory cells are connected to the data channels 11 in a one-to-one relationship. When one of the data channels 11 is enabled, the corresponding memory cell provides the weight it stores, that is, provides the first resistance or the second resistance, and the memory cell array 12 may perform accumulation of the weights provided by the memory cells corresponding to the enabled data channels 11 and generate an electrical parameter (current value or voltage value) corresponding to the accumulation result of the weights as the accumulated data weight value.

The maximum accumulated weight generating array 13 is configured to generate a maximum accumulated weight value according to the quantity of enabled data channels of the data channels 11 and the first resistance. As aforementioned, the first resistance corresponds to weight "1". Accordingly, the operation of the maximum accumulated weight generating array 13 can be regarded as performing accumulation on a specific quantity of weight "1" and generating an electrical parameter (current value or voltage value) corresponding to the accumulation result as the maximum accumulated weight value, wherein the specific quantity is equal to the quantity of enabled data channels. The minimum accumulated weight generating array 14 is configured to generate a minimum accumulated weight value according to the quantity of enabled data channels of the data channels 11 and the second resistance. As aforementioned, the second resistance corresponds to weight "0". Accordingly, the operation of the minimum accumulated weight generating array 14 can be regarded as performing accumulation on a specific quantity of weight "0" and generating an electrical parameter (current value or voltage value) corresponding to the accumulation result as the minimum accumulated weight value, wherein the specific quantity is equal to the quantity of enabled data channels.

The reference generator 15 is configured to generate at least one reference value according to the maximum accumulated weight value and the minimum accumulated weight value. The reference generator 15 can generate at least one reference value between the maximum accumulated weight value and the minimum accumulated weight value. The quantity of the generated reference values may depend on the quantity of enabled data channels of the data channels. For example, the quantity of the generated reference values is the quantity of enabled data channels of the data channels 11 minus one.

The comparator 16 is configured to compare the accumulated data weight value generated by the memory cell array 12 and the reference value(s) generated by the reference generator 15, so as to generate and output a data weight state WS. When the quantity of the reference value is one, the comparator 16 may determine whether the accumulated data weight value is larger or less than the reference value, and take the determined result as the data weight state WS. When the quantity of the reference values is more than one, the comparator 16 may compare the accumulated data weight value with the reference values respectively to generate a number of comparison results, and the comparison results form the data weight state WS.

Figure 2:
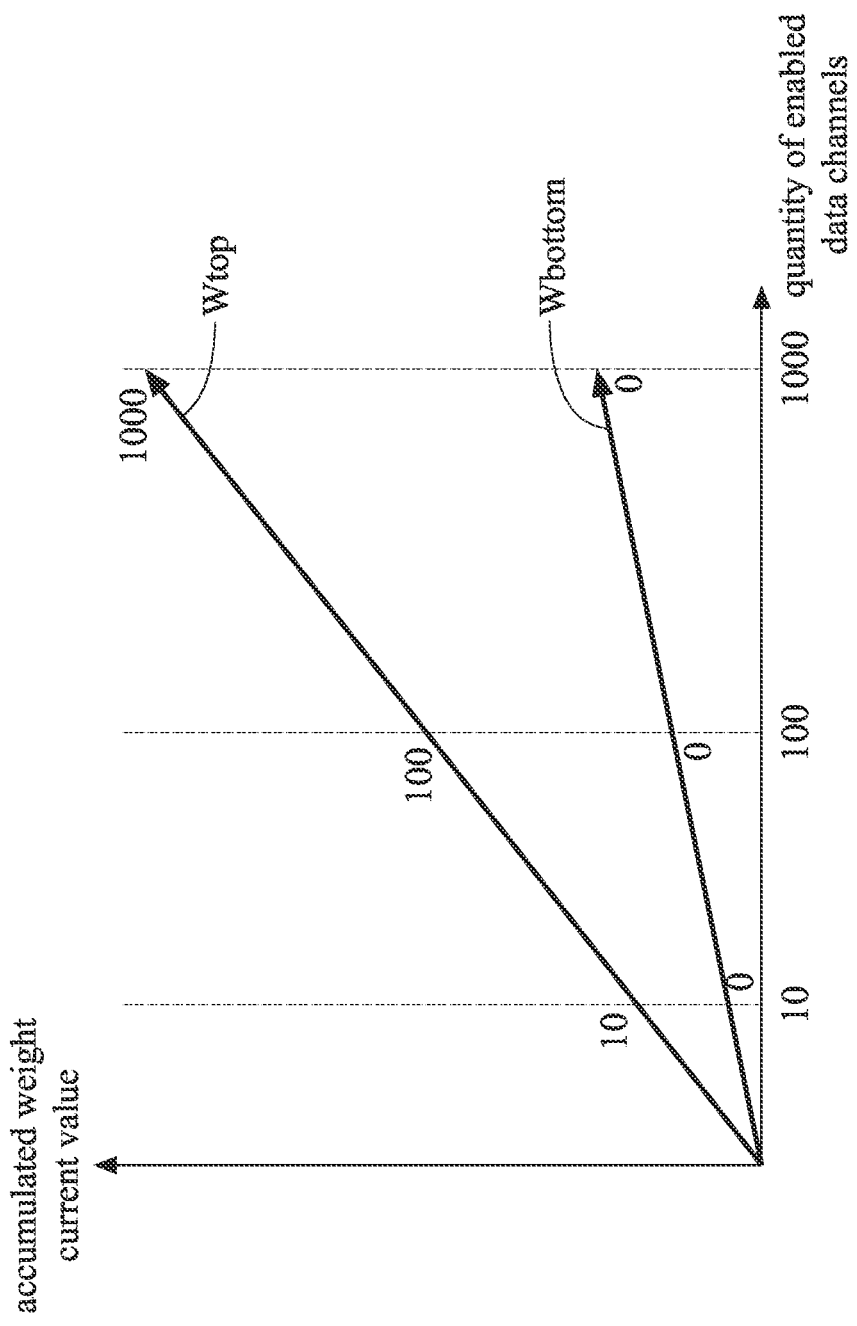
FIG. 2 is a graph showing the relationship between the maximum accumulated weight value and the quantity of enabled data channels and the relationship between the minimum accumulated weight value and the quantity of enabled data channels according to an embodiment of this disclosure.

With the operations of the elements in the memory device 1 as mentioned above, the memory device 1 may adjust the upper and lower limits used to generate the reference value(s) following the changes in the quantity of enabled data channels of the data channels 11, so as to generate the appropriate reference value(s). For illustration, please refer to FIG. 2, a graph showing the relationship between the maximum accumulated weight value and the quantity of enabled data channels and the relationship between the minimum accumulated weight value and the quantity of enabled data channels according to an embodiment of this disclosure. As shown in FIG. 2, for ReRAM, as the quantity of enabled data channels increases, the maximum accumulated weight $\Sigma W_{top}$ of each row of memory cells of memory increases and the current value (accumulated weight current value) corresponding to the maximum accumulated weight $\Sigma W_{top}$ also increases. Although the minimum accumulated weight $\Sigma W_{bottom}$ of each row of memory cells is maintained at 0 as the quantity of enabled data channels increases, the accumulated weight current value corresponding to the minimum accumulated weight $\Sigma W_{bottom}$ increases at this time.

Therefore, the fixed reference value is applicable to the operation mode with a fixed quantity of enabled data channels. In contrast, the memory device 1 in this disclosure can obtain the maximum accumulated weight value (the accumulated weight current value corresponding to the maximum accumulated weight $\Sigma W_{top}$ as mentioned above) and the minimum accumulated weight value (the accumulated weight current value corresponding to the minimum accumulated weight $\Sigma W_{bottom}$ as mentioned above) as the upper and lower limits for generating the reference value(s), so it may be operated with various quantities of enabled data channels and have high adaptability.

Figure 3:
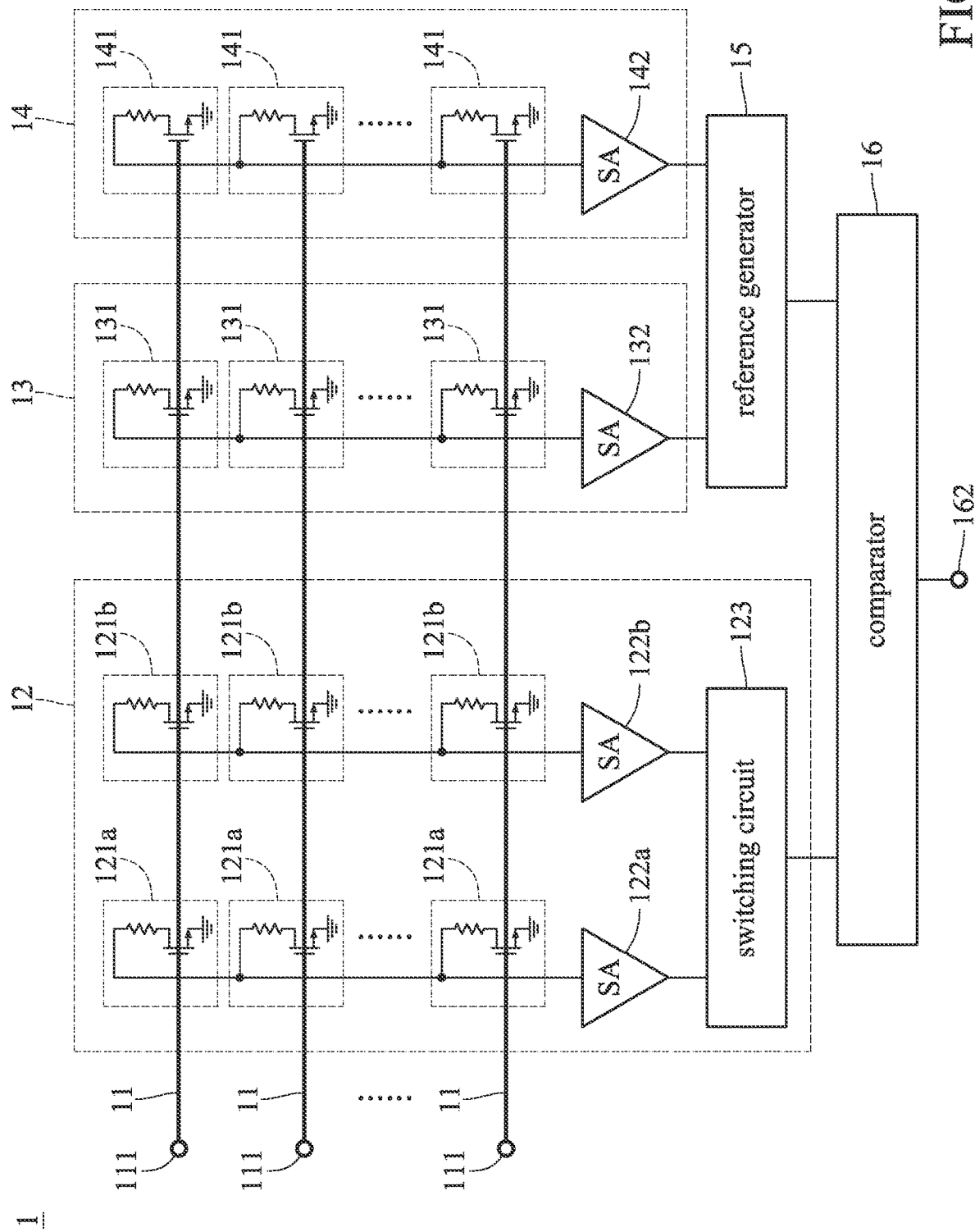
FIG. 3 is a circuit schematic of a memory device according to an embodiment of this disclosure.

For a further description of the circuit of the memory cell array 12, maximum accumulated weight generating array 13 and minimum accumulated weight generating array 14 of the memory device 1, please refer to FIG. 3, a circuit schematic of a memory device according to an embodiment of this disclosure. As shown in FIG. 3, each of the data channels 11 of the memory device 1 has an input terminal 111 for receiving data input. The memory cell array 12 may include a number of memory cells 121*a* and 121*b*, a number of sense amplifiers (SA) 122*a* and 122*b* and a switching circuit 123. The memory cells 121*a* and 121*b* are arranged in two rows, and the two rows are respectively connected to the sense amplifiers 122*a* and 122*b*, and the sense amplifiers 122*a* and 122*b* are both connected to the switching circuit 123.

The memory cells 121*a* in the first row are respectively connected to the data channels 11, and configured to provide a shunt resistance according to the quantity of enabled data channels of the data channels 11. Each memory cell 121*a* may be a one-transistor one-resistor (1T1R) cell. When any one of the data channels 11 receives high electric potential signal (i.e. being enabled), the transistor of the corresponding memory cell 121*a* is turned on and the current flows through the resistor. The resistors of the memory cells 121*a* corresponding to the enabled data channels 11 are connected in parallel to form the shunt resistance. The sense amplifier 122*a* is configured to generate a first weight value according to the shunt resistance provided by the memory cells 121*a* in the first row. The sense amplifier 122*a* may generate an electrical parameter (current value or voltage value) corresponding to the shunt resistance provided by the memory cells 121*a* in the first row. The memory cells 121*b* in the second row have the same operations of the memory cells 121*a* in the first row and the sense amplifier 122*a*. The memory cells 121*b* in the second row are respectively connected to the data channels 11 and configured to provide a shunt resistance according to the quantity of enabled data channels of the data channels 11, and the sense amplifier 122*b* is configured to generate a second weight value according to the shunt resistance.

The switching circuit 123 is configured to switch to take one of the first weight value and the second weight value as the accumulated data weight value. The switching circuit 123 may include a number of switching elements respectively connected between the sense amplifier 122*a* and the comparator 16, and between the sense amplifier 122*b* and the comparator 16. The switching elements may be controlled by signals or humans to conduct the circuit between the sense amplifier 122*a* and the comparator 16 or the circuit between the sense amplifier 122*b* and the comparator 16.

FIG. 3 exemplarily shows that the memory cell array 12 includes two rows of memory cells 121*a* and 121*b* and two sense amplifiers 122*a* and 122*b*. However, in other embodiments, the memory cell array may have one or more than two rows of memory cells and the sense amplifier(s) with the corresponding quantity. In the embodiment where the memory cell array has more than two rows of memory cells, the switching circuit may switch to conduct the circuit between the comparator and one of the rows of memory cells to obtain the accumulated data weight value. In the embodiment where the memory cell array has one row of memory cells, there is no need to set the switching circuit in the memory cell array. In this embodiment, the memory cell provides a shunt resistance according to the quantity of enabled data channels, and the sense amplifier then generates the accumulated data weight value according to this shunt resistance.

In FIG. 3, the maximum accumulated weight generating array 13 includes a number of first resistor units 131 and a sense amplifier 132, wherein the first resistor units 131 are connected in series and connected to the sense amplifier 132. The first resistor units 131 each have the first resistance and are respectively connected to the data channels 11 and configured to provide a shunt resistance according to the quantity of enabled data channels of the data channels 11. Each first resistor unit 131 may be a one-transistor one-resistor (1T1R) cell, wherein its resistor has the first resistance. As aforementioned, the first resistance indicates the low-resistance state. Hereinafter, the resistor with the first resistance is called "low-resistance state resistor". When any one of the data channels 11 receives high electric potential signal (i.e. being enabled), the transistor of the corresponding first resistor unit 131 is turned on and the current flows through the low-resistance state resistor. The low-resistance state resistors of the first resistor units 131 corresponding to the enabled data channels 11 are connected in parallel to form the shunt resistance. In other words, the shunt resistance provided by the first resistor units 131 is formed by connecting the low-resistance state resistors with the same quantity as the enabled data channels in parallel. The sense amplifier 132 is configured to generate the maximum accumulated weight value according to the shunt resistance generated by the first resistor units 131. The sense amplifier 132 may generate an electrical parameter (current value or voltage value) corresponding to the shunt resistance provided by the first resistor units 131 as the maximum accumulated weight value.

The minimum accumulated weight generating array 14 includes a number of second resistor units 141 and a sense amplifier 142, wherein the second resistor units 141 are connected in series and connected to the sense amplifier 142. The second resistor units 141 each have the second resistance and are respectively connected to the data channels 11 and configured to a shunt resistance according to the quantity of enabled data channels of the data channels 11. Each second resistor unit 141 may be a one-transistor one-resistor (1T1R) cell, wherein its resistor has the second resistance. As aforementioned, the second resistance indicates the high-resistance state. Hereinafter, the resistor with the second resistance is called "high-resistance state resistor". When any one of the data channels 11 receives high electric potential signal (i.e. being enabled), the transistor of the corresponding second resistor unit 141 is turned on and the current flows through the high-resistance state resistor. The high-resistance state resistors of the second resistor units 141 corresponding to the enabled data channels 11 are connected in parallel to form the shunt resistance. In other words, the shunt resistance provided by the second resistor units 141 is formed by connecting the high-resistance state resistors with the same quantity as the enabled data channels in parallel. The sense amplifier 142 is configured to generate the minimum accumulated weight value according to the shunt resistance generated by the second resistor units 141. The sense amplifier 142 may generate an electrical parameter (current value or voltage value) corresponding to the shunt resistance provided by the second resistor units 141 as the minimum accumulated weight value.

The reference generator 15 is connected to the maximum accumulated weight generating array 13 and the minimum accumulated weight generating array 14, and can generate at least on reference value according to the maximum accumulated weight value and the minimum accumulated weight value. The comparator 16 is connected to the memory cell array 12 and the reference generator 15, and can compare the accumulated data weight value obtained from the memory cell array 12 with said at least one reference value to generate the data weight state, and output the data weight state through the output terminal 162.

Figures 4, 5A, 5B:
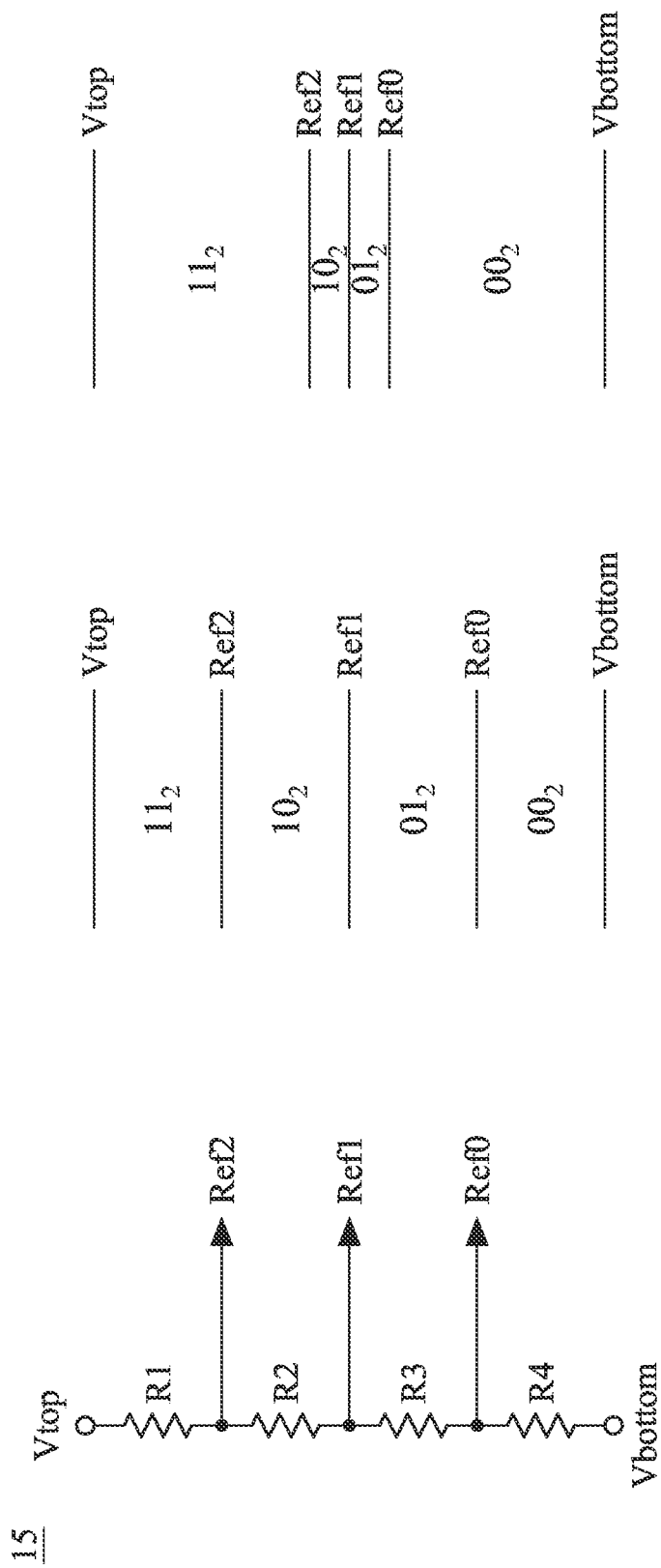
FIG. 4 is a circuit schematic of a reference generator in a memory device according to an embodiment of this disclosure.
FIG. 5A is a schematic of reference values generated by a memory device according to an embodiment of this disclosure.
FIG. 5B is a schematic of reference values generated by a memory device according to another embodiment of this disclosure.

For a further description of the circuit of the reference generator 15, please refer to FIG. 4, a circuit schematic of a reference generator in a memory device according to an embodiment of this disclosure. As shown in FIG. 4, the reference generator 15 may include a resistor string R1-R4 composed of a number of resistors connected in series. Both ends of the resistor string R1-R4 can receive the maximum accumulated weight value Vtop and the minimum accumulated weight value Vbottom respectively; that is to say, both ends of the resistor string R1-R4 are respectively connected to the maximum accumulated weight generating array 13 and the minimum accumulated weight generating array 14. There is a reference value output terminal existing between each two of the resistors in the resistor string R1-R4. The reference value output terminal is configured to provide a reference value (i.e. the voltage value at the reference value output terminal. In an example where the resistor string R1-R4 includes four resistors, the resistor string R1-R4 has three reference value output terminals respectively output reference values Ref2, Ref1 and Ref0, and these three reference values Ref2, Ref1 and Ref0 may be configured to distinguish four data weight states, e.g. $11_2$, $10_2$, $01_2$ and $00_2$.

It should be noted that FIG. 4 merely exemplarily illustrates four resistors and the three reference values generated by them, and is not intended to limit the quantity of the resistors of the reference generator 15 and the quantity of the reference values. Moreover, the circuit shown in FIG. 4 is applicable for the implementation where the maximum accumulated weight value and the minimum accumulated weight value are voltage values. For the implementation where the maximum accumulated weight value and the minimum accumulated weight value are current values, the reference generator 15 may further include a current-to-voltage converter circuit connected between the maximum accumulated weight generating array 13 and the resistor string and connected between the minimum accumulated weight generating array 14 and the resistor string, for converting the maximum accumulated weight value and the minimum accumulated weight value into voltage values.

Please refer to FIG. 4, FIG. 5A and FIG. 5B, wherein FIG. 5A is a schematic of reference values generated by a memory device according to an embodiment of this disclosure, and FIG. 5B is a schematic of reference values generated by a memory device according to another embodiment of this disclosure. In the embodiment of FIG. 5A, each of the resistors in the resistor string R1-R4 has the same resistance. Therefore, as shown in FIG. 5A, the reference values Ref2, Ref1 and Ref0 are evenly distributed between the maximum accumulated weight value Vtop and the minimum accumulated weight value Vbottom; that is, the four data weight states $11_2$, $10_2$, $01_2$ and $00_2$ distinguished by the reference values Ref2, Ref1 and Ref0 have the same size of judgement ranges. In the embodiment of FIG. 5B, the quantity of the resistors in the resistor string R1-R4 is a multiple of 2, and the resistances of the resistors in the resistor string R1-R4 gradually decrease from both ends of the resistor string R1-R4 to the center of the resistor string R1-R4. For example, the resistance of each of the resistors R1 and R4 is 10 times of that of each of the resistors R2 and R3. In this way, as shown in FIG. 5B, the judgment ranges of the data weight states $11_2$, $10_2$, $01_2$ and $00_2$ may be normally distributed, which is particularly suitable for artificial intelligence (AI) operations. FIG. 5A and FIG. 5B exemplarily show two distribution settings of reference values, but this disclosure is not limited to these.

Figure 6:
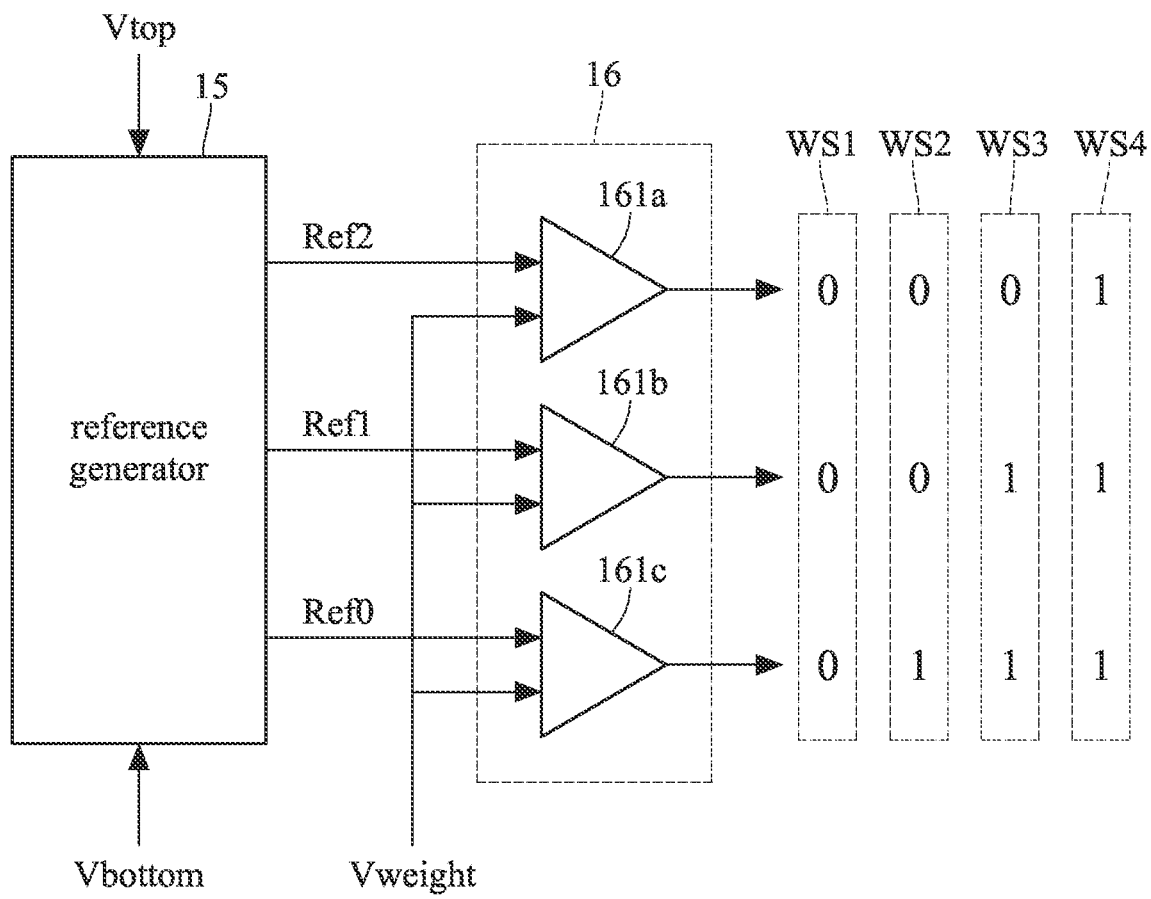
FIG. 6 is a circuit schematic of part of the circuit of a memory device according to an embodiment of this disclosure.

For a further description of the circuit of the comparator 16, please refer to FIG. 6, a circuit schematic of part of the circuit of a memory device according to an embodiment of this disclosure. As shown in FIG. 6, the comparator 16 includes a number of comparing elements 161a, 161b and 161c. The quantity of the comparing elements 161a, 161b and 161c used as the comparator 16 performs comparison corresponds to the quantity of the reference values Ref2, Ref1 and Ref0. The comparing elements 161a, 161b and 161c can compare the accumulated data weight value with the reference values Ref2, Ref1 and Ref0 respectively, and output the comparison results in digital or analog form. In an example where the comparison results are output in digital form, when the accumulated data weight value is larger than the reference value Ref2, the comparing element 161a outputs "1"; when the accumulated data weight value is less than the reference value Ref2, the comparing element 161a outputs "0". The comparing elements 161b and 161c also have the same comparison mechanism.

The comparison results respectively output by the comparing elements 161a, 161b and 161c can form the data weight state WS1, WS2, WS3 or WS4. FIG. 6 exemplarily shows four data weight states WS1-WS4 corresponding to three reference values Ref2, Ref1 and Ref0, wherein the data weight state WS1 indicates $00_2$, the data weight state WS2 indicates $01_2$, the data weight state WS3 indicates $10_2$, and the data weight state WS4 indicates $11_2$. The three reference values and the four data weight states distinguished by the reference values shown in FIG. 6 are merely exemplary, and the quantity of the reference values generated by the reference generator 15 and the quantity of the data weight states are not limited to these.

Figure 7:
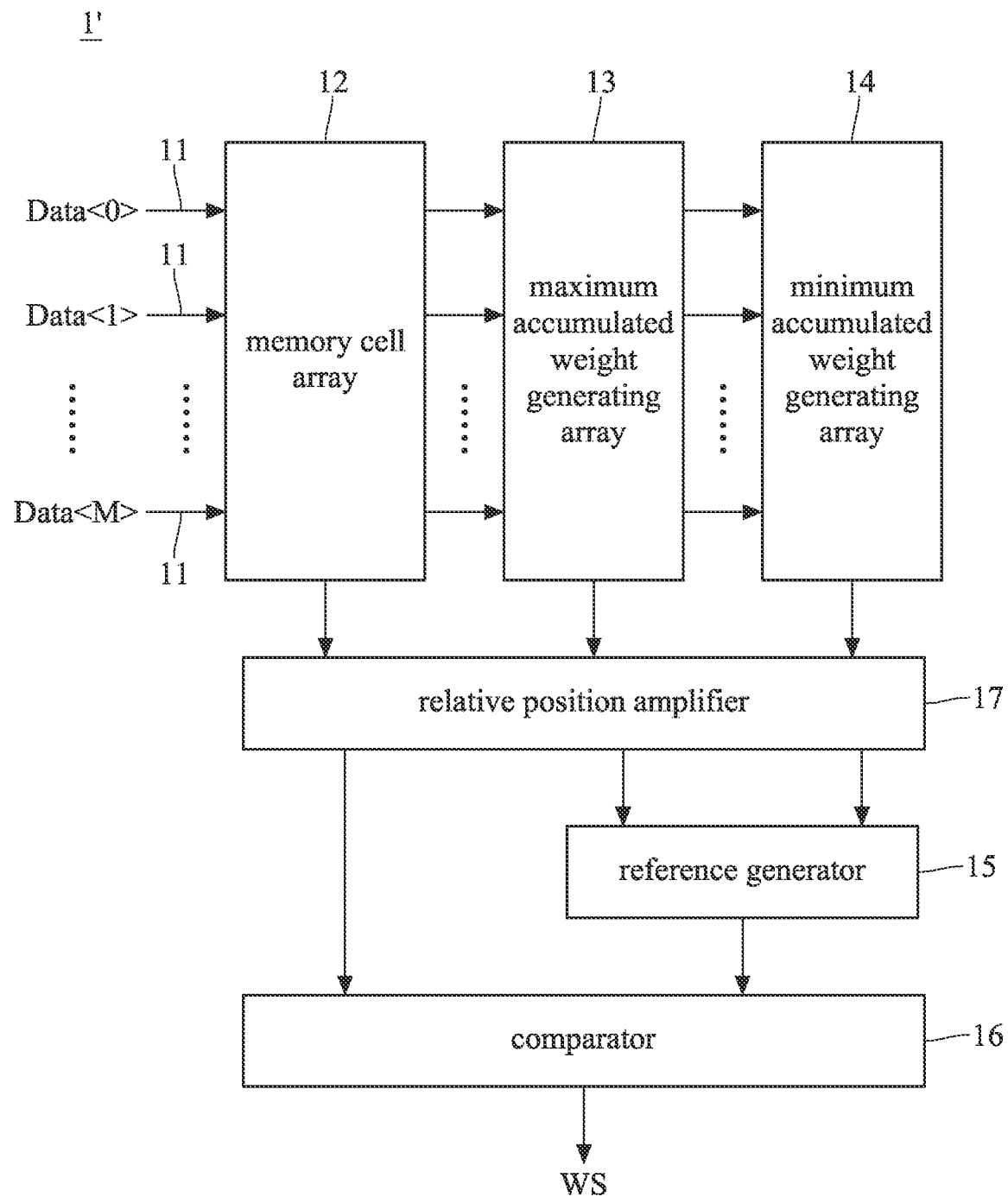
FIG. 7 is a function block diagram of a memory device according to another embodiment of this disclosure.

Please refer to FIG. 7, a function block diagram of a memory device according to another embodiment of this disclosure. As shown in FIG. 7, besides the data channels 11, memory cell array 12, maximum accumulated weight generating array 13, minimum accumulated weight generating array 14, reference generator 15 and comparator 16 as described in the above embodiments, a memory device 1' further includes a relative position amplifier 17. The operations of the data channels 11, the memory cell array 12, the maximum accumulated weight generating array 13, the minimum accumulated weight generating array 14, the reference generator 15 and the comparator 16 are the same as those in the above embodiments, so they are not repeated here.

The relative position amplifier 17 has three input terminals respectively connected to the memory cell array 12, the maximum accumulated weight generating array 13 and the minimum accumulated weight generating array 14. The relative position amplifier 17 is configured to perform amplification on voltage differences among the accumulated data weight value, the maximum accumulated weight value and the minimum accumulated weight value, and then output the maximum accumulated weight value and the minimum accumulated weight value respectively through two output terminals connected to the reference generator 15 to the reference generator 15 after the amplification, for the reference generator 15 to generate one or more reference values. The relative position amplifier 17 also outputs the accumulated data weight value through another output terminal connected to the comparator 16 to the comparator 16 after the amplification, for the comparator 16 to determine the data weight state WS.

Figure 8:
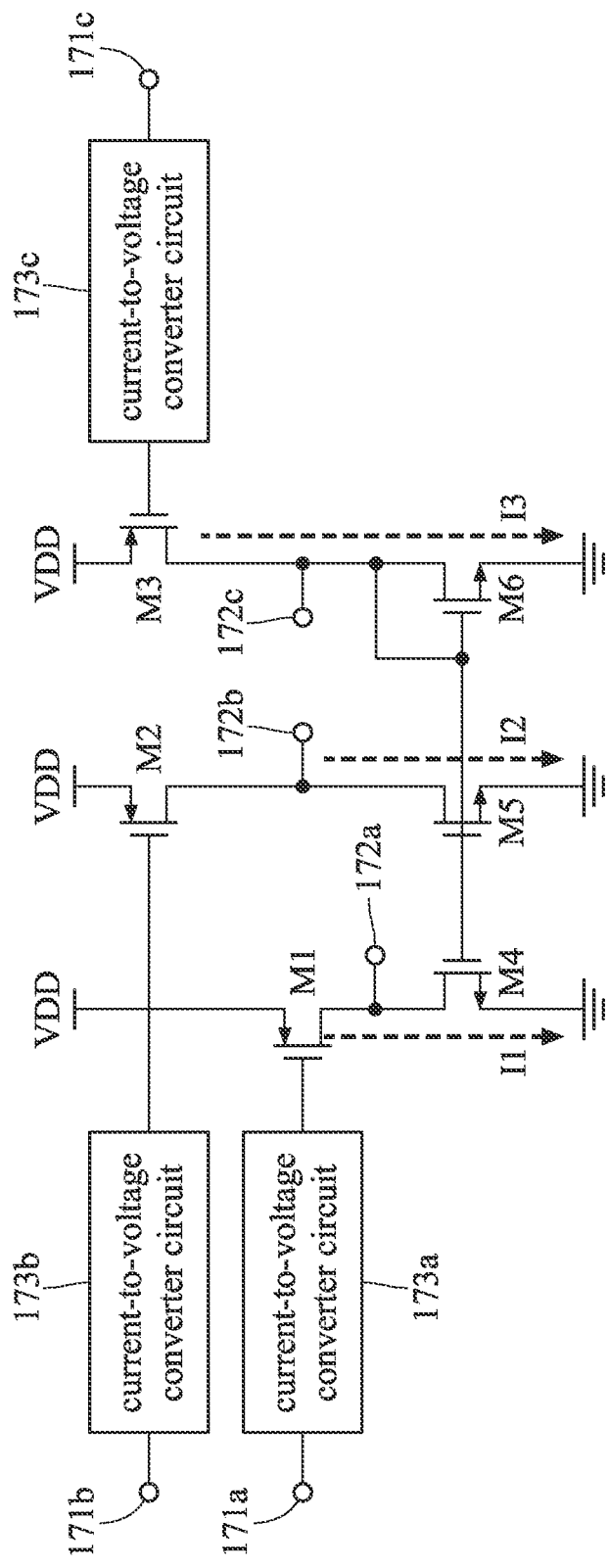
FIG. 8 is a circuit schematic of a relative position amplifier in a memory device according to an embodiment of this disclosure.
Figure 9:
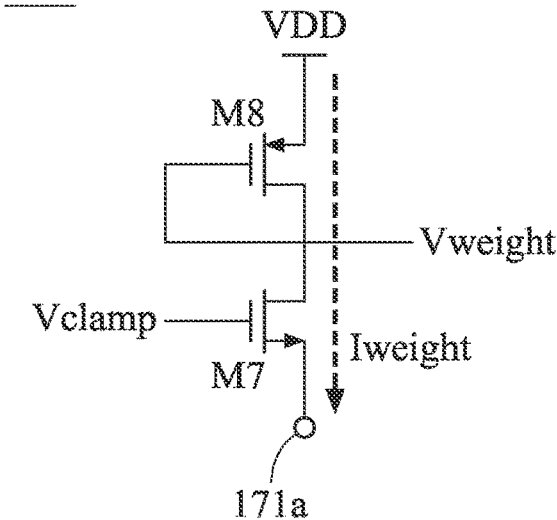
FIG. 9 is a circuit schematic of a current-to-voltage converter circuit in a memory device according to an embodiment of this disclosure.

For a further description of the circuit of the relative position amplifier 17, please refer to FIG. 8 and FIG. 9, wherein FIG. 8 is a circuit schematic of a relative position amplifier in a memory device according to an embodiment of this disclosure, and FIG. 9 is a circuit schematic of a current-to-voltage converter circuit in a memory device according to an embodiment of this disclosure.

As shown in FIG. 8, the relative position amplifier 17 have three input terminals 171a-171c, three output terminals 172a-172c, three current-to-voltage converter circuits 173a-173c, and a number of transistors M1-M6. The input terminals 171a-171c are respectively connected to the memory cell array 12, the maximum accumulated weight generating array 13 and the minimum accumulated weight generating array 14 to receive the accumulated data weight value, the maximum accumulated weight value and the minimum accumulated weight value. The current-to-voltage converter circuits 173a-173c are respectively connected to the input terminals 171a-171c to convert the accumulated data weight value, the maximum accumulated weight value and the minimum accumulated weight value to voltage values. As shown in FIG. 9, the current-to-voltage converter circuit 173a may include transistors M7 and M8, wherein the source of the transistor M7 is connected to the input terminal 171a to receive the current Iweight generated by the memory cell array 12, the gate of the transistor M7 is configured to receive the clamp voltage Vclamp, the drain of the transistor M7 is connected to the drain of the transistor M8, the source of the transistor M8 is configured to receive the work voltage VDD, and the gate of the transistor M8 can provide the voltage value corresponding to the current Iweight as the converted accumulated data weight value Vweight. The gate of the transistor M8 is connected to the gate of transistor M1 shown in FIG. 8 so that the converted accumulated data weight value can be provided to the amplifier circuit formed by the transistors M1-M6 for the above-mentioned amplification. The composition and operation of the current-to-voltage converter circuit 173b and 173c are the same as those of the current-to-voltage converter circuit 173a, so they are not repeated here.

The relative position amplifier 17 with the current-to-voltage converter circuits 173a-173c is applicable to the implementation where the maximum accumulated weight value and the minimum accumulated weight value are current values. For the implementation where the maximum accumulated weight value and the minimum accumulated weight value are originally voltage values, there is no need to set the current-to-voltage converter circuits 173a-173c in the relative position amplifier 17.

In FIG. 8, the transistors M1, M3, M4 and M6 form a first differential amplifier, configured to amplify the voltage difference between the accumulated data weight value and the minimum accumulated weight value by a specific amplification factor. The first differential amplifier may generate the current I1 corresponding to the voltage difference, having been amplified by the specific amplification factor, between the accumulated data weight value and the minimum accumulated weight value based on the current I3 corresponding to the minimum accumulated weight value. The gates of the transistors M1 and M3 respectively receive the accumulated data weight value and the minimum accumulated weight value, the sources of the transistors M1 and M3 both receive the work voltage VDD, and the drains of the transistors M1 and M3 are respectively connected to the drains of the transistors M4 and M6. The transistors M4 and M6 form a current mirror, so the connection therebetween is not described in details.

The transistors M2, M3, M5 and M6 form a second differential amplifier, configured to amplify the voltage difference between the maximum accumulated weight value and the minimum accumulated weight value by the specific amplification factor. The second differential amplifier may generate the current I2 corresponding to the voltage difference, having been amplified by the specific amplification factor, between the accumulated data weight value and the maximum accumulated weight value based on the current I3 corresponding to the minimum accumulated weight value. The gate of the transistor M2 receives the maximum accumulated weight value, the source of the transistor M2 receives the work voltage VDD, and the drain of the transistor M2 is connected to the drain of the transistor M5. The transistors M5 and M6 also form a current mirror, so the connection therebetween is not described in details.

The values of the currents I1, I2 and I3 can be calculated by the following formulas:

$$I1 = A*(I_{weight} - I_{bottom});$$

$$I2 = A*(I_{top} - I_{bottom});$$

$$I3 = I_{bottom};$$

wherein $I_{weight}$ represents the current value corresponding to the accumulated data weight value, $I_{bottom}$ represents the current value corresponding to the minimum accumulated weight value, $I_{top}$ represents the current value corresponding to the maximum accumulated weight value, and A represents a specific amplification factor.

The output terminals 172a-172c are respectively connected to the drains of the transistors M1, M2 and M3 to obtain the accumulated data weight value, maximum accumulated weight value and minimum accumulated weight value that have been processed by the amplification. The output terminal 172a is connected to the comparator 16 to provide the accumulated data weight value that has been processed by the amplification to the comparator 16, and the output terminals 172b and 172c are connected to the reference generator 15 to provide the maximum accumulated weight value and minimum accumulated weight value that have been processed by the amplification to the reference generator 15. The above exemplarily describes the implementation of the amplification on the basis of the minimum accumulated weight value. In other implementations, the relative position amplifier 17 may perform amplification on the basis of the maximum accumulated weight value or the accumulated data weight value.

Figure 10:
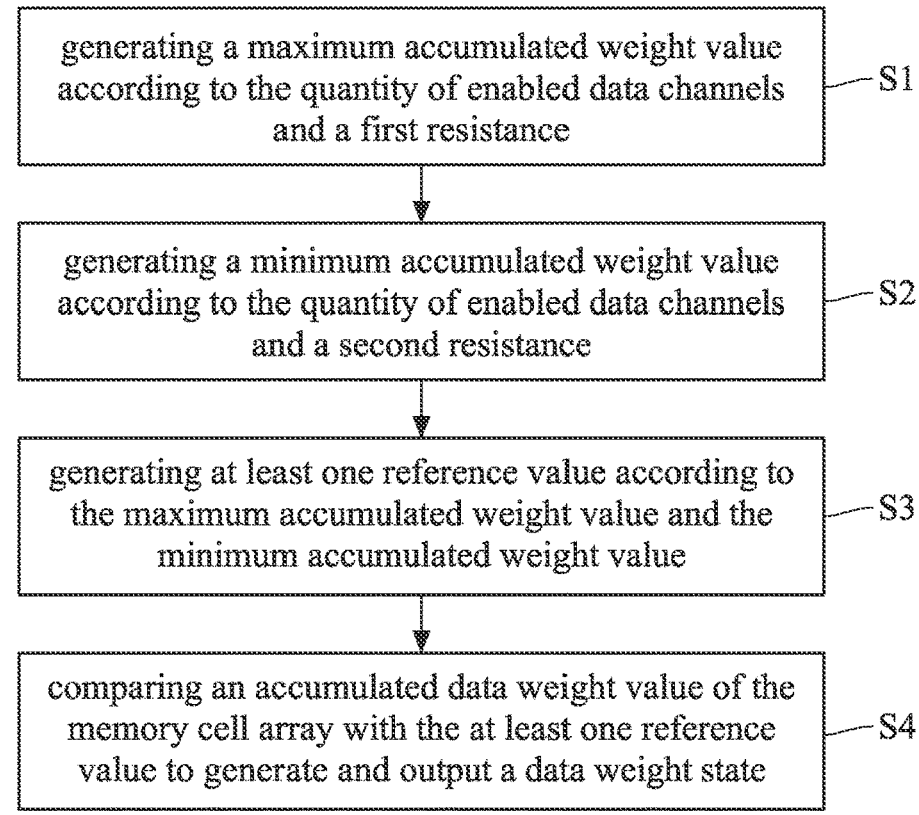
FIG. 10 is a flow chart of a data weight state determining method according to an embodiment of this disclosure.

A data weight state determining method for in-memory computation is also provided in this disclosure. Please refer to FIG. 10, a flow chart of a data weight state determining method according to an embodiment of this disclosure. As shown in FIG. 10, a data weight state determining method includes step S1: generating a maximum accumulated weight value according to the quantity of enabled data channels and a first resistance; step S2: generating a minimum accumulated weight value according to the quantity of enabled data channels and a second resistance; step S3: generating at least one reference value according to the maximum accumulated weight value and the minimum accumulated weight value; step S4: comparing an accumulated data weight value of the memory cell array with the at least one reference value to generate and output a data weight state. The data weight state determining method is applicable to a memory device including a number of data channels and a memory cell array, such as the memory device 1 or 1' in the aforementioned embodiments. More particularly, the above step S1 can be performed by the maximum accumulated weight generating array 13 of the memory device 1 in FIG. 1 or the memory device 1' in FIG. 7, the above step S2 can be performed by the minimum accumulated weight generating array 14 may of the memory device 1 in FIG. 1 or the memory device 1' in FIG. 7, the above step S3 can be performed by the reference generator 15 of the memory device 1 in FIG. 1 or the memory device 1' in FIG. 7, and the above step S4 can be performed by the comparator 16 of the memory device 1 in FIG. 1 or the memory device 1' in FIG. 7. The detailed operations of steps S1-S4 are the same as the operations of the elements as described in the above embodiments, and are not repeated here.

In view of the above description, by generating upper and lower limits following the quantity of enabled data channels for generating one or more reference values, the memory device and data weight state determining method for in-memory computation in this disclosure may be operated with various quantities of enabled data channels without being limited to a fixed operation mode, and have high adaptability.

What is claimed is:

1. A memory device for in-memory computation, comprising:
    a plurality of data channels having a quantity of enabled data channels according to data input;
    a memory cell array connected to the plurality of data channels, and configured to generate an accumulated data weight value according to the quantity of enabled data channels, a first resistance and a second resistance;
    a maximum accumulated weight generating array connected to the plurality of data channels, and configured to generate a maximum accumulated weight value according to the quantity of enabled data channels and the first resistance;
    a minimum accumulated weight generating array connected to the plurality of data channels, and configured to generate a minimum accumulated weight value according to the quantity of enabled data channels and the second resistance;
    a reference generator connected to the maximum accumulated weight generating array and the minimum accumulated weight generating array, and configured to generate at least one reference value according to the maximum accumulated weight value and the minimum accumulated weight value; and
    a comparator connected to the memory cell array and the reference generator, and configured to compare the accumulated data weight value with the at least one reference value to generate and output a data weight state;
    wherein the first resistance is less than the second resistance.

2. The memory device according to claim 1, wherein the maximum accumulated weight generating array comprises:
    a plurality of first resistor units which each have the first resistance, and are respectively connected to the plurality of data channels and configured to provide a first shunt resistance according to the quantity of enabled data channels; and
    a first sense amplifier connected to the plurality of first resistor units, and configured to generate the maximum accumulated weight value according to the first shunt resistance;
    wherein the minimum accumulated weight generating array comprises:
    a plurality of second resistor units which each have the second resistance, and are respectively connected to the plurality of data channels and configured to provide a second shunt resistance according to the quantity of enabled data channels; and
    a second sense amplifier connected to the plurality of second resistor units, and configured to generate the minimum accumulated weight value according to the second shunt resistance.

3. The memory device according to claim 1, further comprising:
    a relative position amplifier having three input terminals respectively connected to the memory cell array, the maximum accumulated weight generating array and the minimum accumulated weight generating array, and configured to perform amplification on voltage differences among the accumulated data weight value, the maximum accumulated weight value and the minimum accumulated weight value, to output the maximum accumulated weight value and the minimum accumulated weight value respectively through two output terminals connected to the reference generator to the reference generator after the amplification, and to output the accumulated data weight value through another output terminal connected to the comparator to the comparator after the amplification.

4. The memory device according to claim 3, wherein the relative position amplifier comprises:
    a first differential amplifier configured to amplify a voltage difference between the accumulated data weight value and the minimum accumulated weight value by a specific amplification factor; and
    a second differential amplifier configured to amplify a voltage difference between the maximum accumulated weight value and the minimum accumulated weight value by the specific amplification factor.

5. The memory device according to claim 1, wherein the reference generator comprises:
    a resistor string having two terminals respectively connected to the maximum accumulated weight generating array and the minimum accumulated weight generating array, wherein a reference value output terminal exists between each two resistors in the resistor string, and the reference value output terminal is configured to provide the at least one reference value.

6. The memory device according to claim 5, wherein resistors in the resistor string have a same resistance.

7. The memory device according to claim 5, wherein a quantity of resistors in the resistor string is a multiple of 2, and resistances of the resistors in the resistor string gradually decrease from both ends of the resistor string to a center of the resistor string.

8. The memory device according to claim 1, wherein the at least one reference value is more than one, and the comparator comprises:
    a plurality of comparing elements compare the accumulated data weight value and the plurality of reference values respectively to generate a plurality of comparison results, wherein the plurality of comparison results form the data weight state.

9. The memory device according to claim 1, wherein the memory cell array comprises:
    a plurality of first memory cells respectively connected to the plurality of data channels, and configured to provide a third shunt resistance according the quantity of enabled data channels, wherein each of the plurality of first memory cells has the first resistance or the second resistance;
a plurality of second memory cells respectively connected to the plurality of data channels, and configured to provide a fourth shunt resistance, according the quantity of enabled data channels, wherein each of the plurality of second memory cells has the first resistance or the second resistance;
a third sense amplifier connected to the plurality of first memory cells, and configured to generate a first weight value according to the third shunt resistance;
a fourth sense amplifier connected to the plurality of second memory cells, and configured to generate a second weight value according to the fourth shunt resistance; and
a switching circuit connected to the third sense amplifier and the fourth sense amplifier, and configured to switch to output one of the first weight value and the second weight value as the accumulated data weight value through an output terminal to the comparator.

10. A data weight state determining method for in-memory computation, applicable to a memory device comprising a plurality of data channels and a memory cell array and comprising:
generating a maximum accumulated weight value according to a quantity of enabled data channels of the plurality of data channels and a first resistance;
generating a minimum accumulated weight value according to the quantity of enabled data channels and a second resistance;
generating at least one reference value according to the maximum accumulated weight value and the minimum accumulated weight value; and
comparing an accumulated data weight value of the memory cell array with the at least one reference value to generate and output a data weight state;
wherein the first resistance is less than the second resistance.

* * * * *